(12) United States Patent
Khellah et al.

(10) Patent No.: US 7,200,068 B2
(45) Date of Patent: Apr. 3, 2007

(54) MULTI-PORTED REGISTER FILES

(75) Inventors: Muhammad M. Khellah, Lake Oswego, OR (US); Yibin Ye, Portland, OR (US); Stephen H. Tang, Beaverton, OR (US); Vivek De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 948 days.

(21) Appl. No.: 10/330,652

(22) Filed: Dec. 27, 2002

(65) Prior Publication Data

US 2004/0139271 A1 Jul. 15, 2004

(51) Int. Cl.
*G11C 8/00* (2006.01)

(52) U.S. Cl. .................... 365/230.05; 365/63
(58) Field of Classification Search ........... 365/230.05, 365/63
See application file for complete search history.

(56) References Cited

U.S. PATENT DOCUMENTS 5,777,928 A 7/1998 Vidwans et al.

2004/0120182 A1* 6/2004 Biyani et al. ............... 365/156
2005/0216698 A1* 9/2005 Chu et al. .................... 712/1

OTHER PUBLICATIONS

Krishnamurthy, Ram, et al., "A 0.13 µm 6GHz 256×32b Leakage-tolerant Register File", *2001 Symposium on VLSI Circuits Digest of Technical Papers*, (Jun. 14-16, 2001), 2 pages.

Tang, Stephen, et al., "A Leakage-Tolerant Dynamic Register File Using Leakage Bypass with Stack Forcing (LBSF) and Source Follower NMOS (SFN) Techniques", *2002 Symposium on VLSI Circuits Digest of Technical Papers*, (Jun. 13-15, 2002), 2 pages.

* cited by examiner

*Primary Examiner*—M. Tran
(74) *Attorney, Agent, or Firm*—Schwegman, Lundberg, Woessner & Kluth, P.A.

(57) ABSTRACT

A multi-ported register comprises a Global Bit Line (GBL) to couple a gate to a data output line via an output transistor. A Local bit Line (LBL) couples the gate to a first register file cell and a second register file cell, said second register file cell disposed closer to the data output line than the first register file cell. At least one transistor in the first register file cell having a stronger drive current than the at least one transistor in the second register file cell. At least one of, the output transistor, the gate, and the first register file cell of a first bank have a stronger drive current than the corresponding output transistor, the gate and the first register file cell of a second bank said second bank being closer to the data output line.

24 Claims, 5 Drawing Sheets

MULTI-PORTED REGISTER FILES

BACKGROUND

1. Field of the Invention

The present invention is related to the field of data storage in a processor. In particular, the present invention is related to a multi-ported register file.

2. Description of the Related Art

Microprocessors utilize multi-ported register files to execute micro-operations. Therefore, to speed up the processing of data, the multi-ported register files typically have single-cycle latencies during read and write operations. To meet the high performance, high-density demand, two-stage local and global bit-line architecture is employed. FIG. 1 illustrates a conventional multi-ported register file. As illustrated in FIG. 1, a conventional multi-ported register file comprises an m-row×n-column array of register file cells with multiple read/write ports. Although, FIG. 1 illustrates a single read port comprising a 256-row×32-column array of register file cells (array), one having ordinary skill in the art will appreciate that multiple read/write ports may be used. The 256 rows of register file cells in the array are grouped into 8 banks of register file cells comprising 32 rows each. Each register file cell 105 in the array stores a binary bit, and is identical in construction to other register file cells in the array. Each register file cell 105 comprises at least a pair of pull-down transistors. The pull-down transistors of a register file cell 105 may comprise n-channel metal oxide semiconductor field effect transistors (n-MOS transistors) that are identical in construction to pull-down transistors in other cells in the array. Each register file cell in a row of the array is driven by a word-line (WL). A keeper (not shown) maintains the charge on each LBL after the LBL is precharged. In the first column of the array, two LBLs (e.g., LBL0 and LBL1) in each bank are merged via a NAND gate 110 and the output of the NAND gate is coupled to at least a pull-down transistor 120. Each LBL couples 16 register file cells in the column to the NAND gate. Each NAND gate in a bank of register file cells is identical in construction to other NAND gates in the array. So also, each pull-down transistor coupled to the output of the NAND gate in a bank of register file cells is identical in construction to other pull-down transistors coupled to the outputs of the NAND gates in the array. As illustrated in the first column of the array of register file cells, a global bit-line (e.g., GBL0) couples at least the pull-down transistor 120 to a data output line D0 via an inverter 140.

Data in register file cells is available at the data output lines D0–D31 by pre-charging a bank and activating a row in the bank using a word-line. Due to the large size of a register file (i.e., the large number of rows) a significant unwanted delay is experienced in accessing data from register file cells that are furthest away from the data output lines D0–D31. For example, data in register file cells in the first row of the array activated by WL0, take longer to reach data output lines D0–D31 (due to at least gate delays and the RC time constant of the traces) than data in register file cells in row 256.

Increasing the strength (i.e., increasing the drive current) of the pull-down transistors of the register file cells to decrease the read delay causes noise immunities of the data read from the register file cells to degrade. This corrupts the data read out of the register file cells due to unacceptable leakage currents of the pull-down transistors comprising the register file cells. Compensating for the leakage currents by increasing the keeper size is not a viable solution as the time to read the data in the register file cell is increased. Also, increasing the number of LBLs by decreasing the number of register file cells coupled to each LBL is not a viable solution as this increases the global multiplexing delay.

BRIEF SUMMARY OF THE DRAWINGS

Example embodiments of the present invention are illustrated in the accompanying drawings. The accompanying drawings, however, do not limit the scope of the present invention. Similar references in the drawings indicate similar elements.

DETAILED DESCRIPTION

Described is a multi-ported register file. One embodiment of the multi-ported register file comprises a Global Bit Line (GBL) to couple a gate to a data output line via an output (e.g., a pull-down) transistor. A Local bit Line (LBL) couples the gate to a first register file cell and a second register file cell, said second register file cell disposed closer to the data output line than the first register file cell. The gate and said each register file cell comprising at least one transistor, said at least one transistor in the first register file cell having a stronger drive current than the at least one transistor in the second register file cell. The pull-down transistor, the gate, the first register file cell and the second register file cell comprise a first bank. The first bank disposed further from the data output line than a second bank, said second bank comprising a corresponding pull-down transistor, a corresponding gate, a corresponding first register file cell and a corresponding second register file cell. At least one of, the pull-down transistor, the gate, and the first register file cell of the first bank have a stronger drive current than the corresponding pull-down transistor, the gate and the first register file cell of the second bank.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art to effect such feature, structure, or characteristic in connection with other embodiments whether or not explicitly described. Parts of the description are presented using terminology commonly employed by those of ordinary skill in the art to convey the substance of their work to others of ordinary skill in the art.

In the following description and claims, the terms "coupled" and "connected", along with derivatives such as "communicatively coupled" may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct physical contact with each other, but still co-operate or interact with each other.

Figure 1:
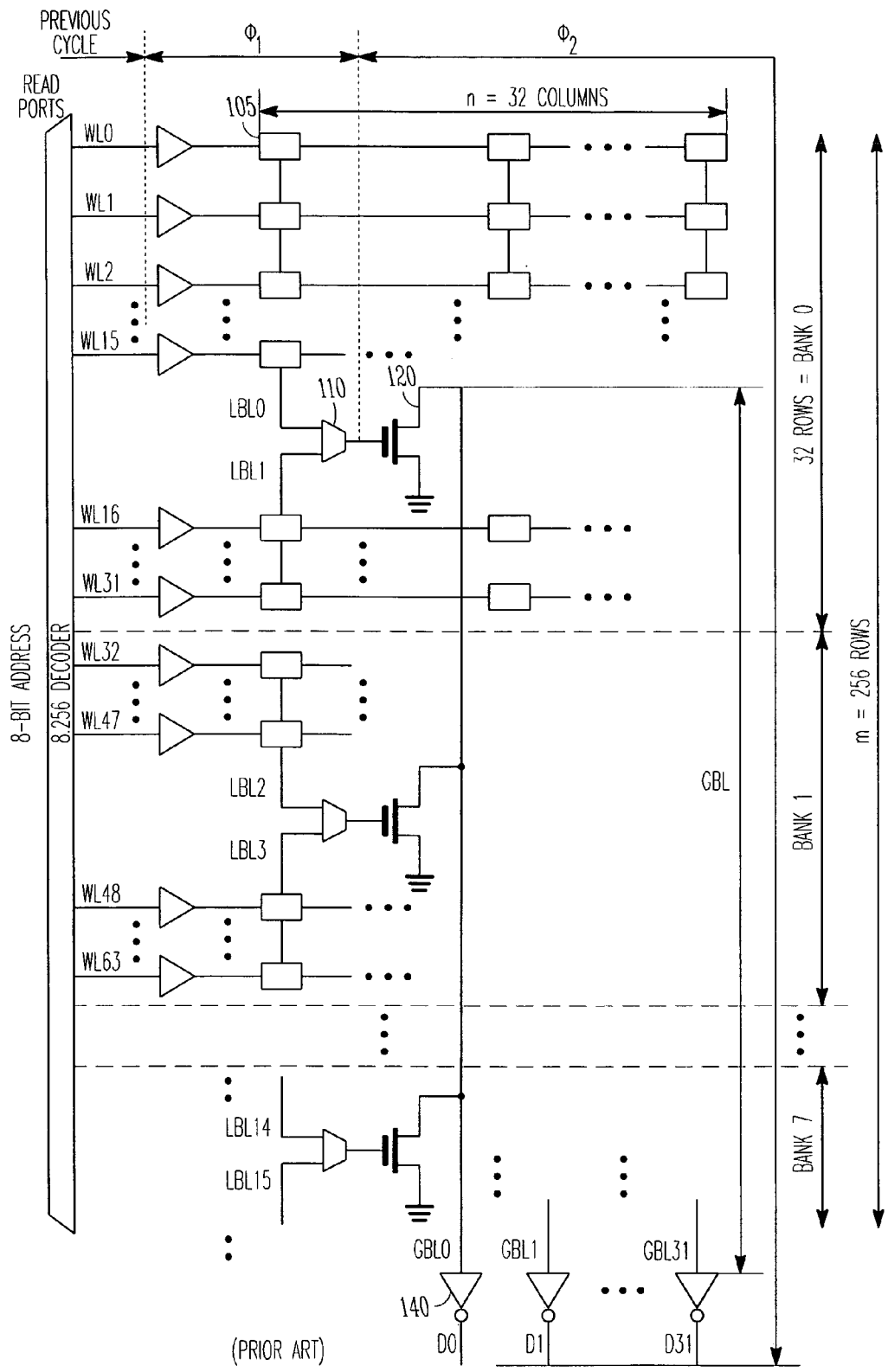
FIG. 1 illustrates a conventional multi-ported register file.
Figure 2:
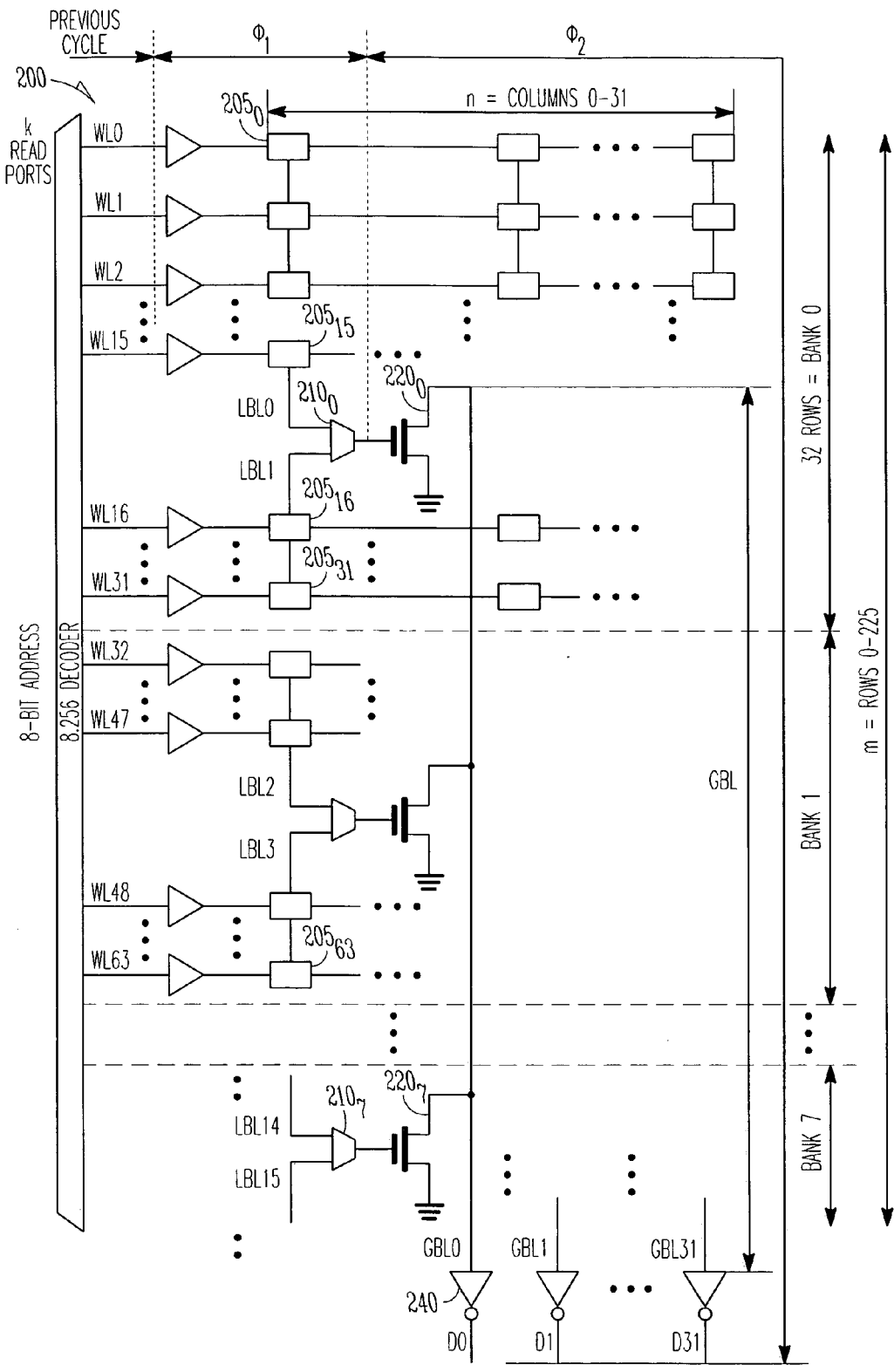
FIG. 2 illustrates a multi-ported register file according to one embodiment of the invention.

FIG. 2 illustrates a multi-ported register file according to one embodiment of the invention. In FIG. 2, register file 200 comprises an m-row×n-column array of register file cells with k read/write ports. Thus, register file 200 of FIG. 2 comprises a 256-row×32-column array of register file cells (array), where k=1 read port. The 256 rows (numbered 0–255) and 32-columns (numbered 0–31) of register file cells in the array are grouped into 8 banks of register file cells comprising 32 rows each. Other groupings of register file cells to comprise a bank may also be used. One having ordinary skill in the art will appreciate that in the physical layout of the integrated circuit of the register file 200, the 8 banks comprising the register file cells are at increasing distances from data output lines D0–D31. Thus, in the physical layout of the integrated circuit of the register file 200 bank 0 is furthest away and bank 7 is closest to the data output lines D0–D31.

In one embodiment of the invention, register file cells are coupled to data output lines e.g., D0–D31 as follows: Within each bank, 16 of the 32 register file cells in a column of the array are coupled to a local bit-line (LBL). For example, in column 0 in bank 0 register file cells $205_0$–$205_{15}$ are coupled to LBL0. So also, register file cells $205_{16}$–$205_{31}$ are coupled to LBL1. LBL0 and LBL1 are coupled to a gate $210_0$ (e.g., a NAND gate), and the gate $210_0$ is coupled to a global bit-line (e.g., GBL0) via at least an output transistor e.g., a pull-down transistor $220_0$. The GBL couples the output of the pull-down transistor to a data output line e.g., D0 via an inverter e.g., inverter 220. The arrangement described above for coupling register file cells in a given column of a bank to a data output line is true for each column of register file cells in any given bank. One having ordinary skill in the art will realize that in the physical layout of the integrated circuit of the register file 200, the 16 register file cells coupled to each LBL are at increasing distances from the gate. For example, in column 0 of bank 0 register file cells $205_0$ and $205_{31}$ may be substantially equidistant to the gate $210_0$ and are furthest from the gate $210_0$. Whereas, register file cells $205_{15}$ and $205_{16}$ may be substantially equidistant to the gate $210_0$ and nearest to the gate $210_0$.

Since the banks (i.e., bank 0 to bank 7) are at increasing distances from the data output lines D0–D31, for a given column of a bank, each gate and pull-down transistor are at increasing distances from a data output line. For example, in column 0 of bank 0 gate $210_0$ and pull-down transistor $220_0$ are furthest away from the data output line D0 as compared with gate $210_7$ and pull-down transistor $220_7$.

Figure 3:
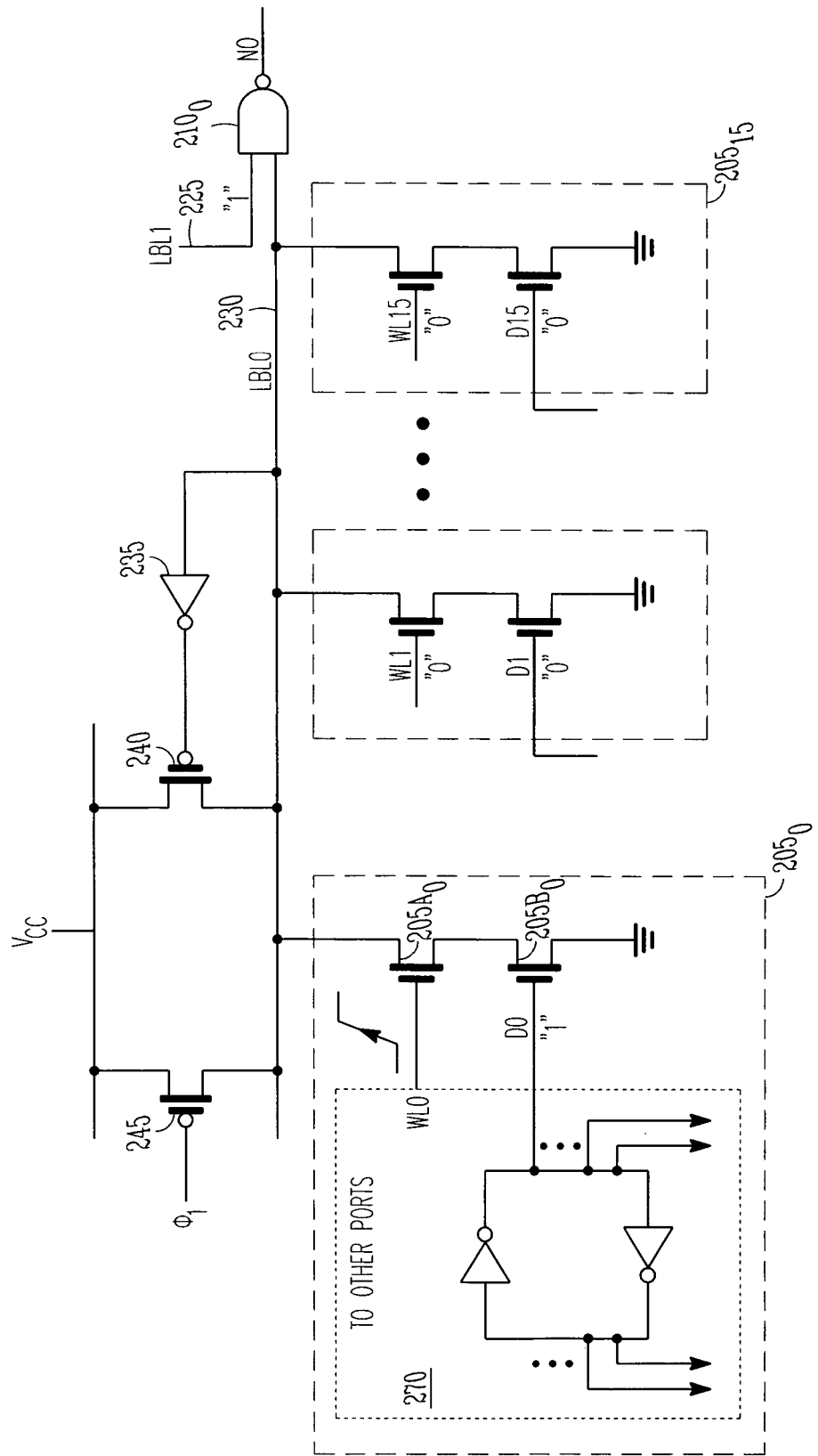
FIG. 3 illustrates register file cells coupled to a local bit-line in a bank according to one embodiment of the invention.
Figure 4:
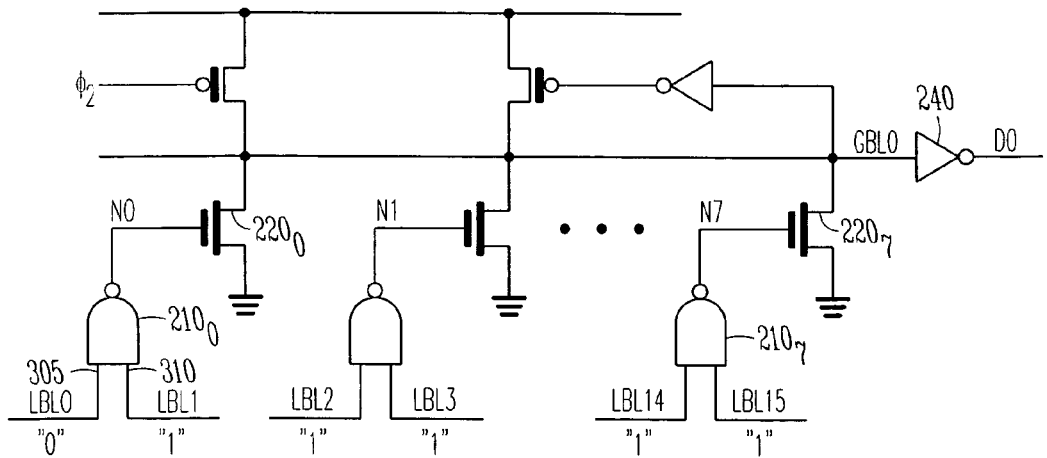
FIG. 4 illustrates transistors coupled by a global bit-line to a data output line according to one embodiment of the invention.

FIG. 3 illustrates register file cells coupled to a local bit-line (LBL) in a bank according to one embodiment of the invention. For a given column in a bank, as described above, 16 register file cells are coupled to a LBL. Thus, in column 0 of bank 0 register file cells $205_0$–$205_{15}$ are coupled to LBL0. So also, register file cells $205_{16}$–$205_{31}$ is coupled to LBL1 (not shown). Each register file cell comprises at least a coupled pair of pull-down n-channel metal oxide semiconductor field effect transistors (n-MOS transistors). Thus, for column 0, register file cell $205_0$ comprises pull-down n-MOS transistor pair $205A_0$–$205B_0$. In each register file cell pull-down n-MOS transistor 205B reads a binary data bit (stored on coupled inverter pair 270) while pull-down n-MOS transistor 205A is activated to access the binary data bit read by n-MOS transistor 205B. The coupled inverter pair 270 coupled to the gate of each pull-down transistor 205B stores a binary bit and its compliment. Prior to a read cycle, at least one LBL is pre-charged and at least a register file cell in a row of a bank is activated by a word-line (WL). Thus, prior to a read cycle for accessing data stored in register file cell $205_0$, LBL0 is pre-charged and pull-down n-MOS transistor $205A_0$ is activated by word-line (WL0). A keeper comprising p-MOS transistor 240 and inverter 235 maintains the charge on each LBL after an LBL is pre-charged. Both LBL0 and LBL1 are pre-charged so that both inputs to the NAND gate $210_0$ are high and the output of the NAND gate $210_0$ is 0. When WL0 is activated, the pull-down n-MOS transistor $205A_0$ is turned on and LBL0 is pulled to ground since pull-down n-MOS transistor $205B_0$ has a binary 1 at the gate. Thus, a binary 0 is present on the LBL0 input of the NAND gate $210_0$ changing the output of the NAND gate $210_0$ from a 0 to a 1. The output of the NAND gate $210_0$ is coupled by GBL0 to the data output line D0 via an inverter 240 as illustrated in FIG. 4. Thus, the high output of the NAND gate $210_0$ turns on output transistor e.g., pull-down n-MOS transistor $220_0$ coupled to the output of the NAND gate $210_0$ causing a 0 to be coupled to the input of inverter 240 by GBL0. Inverter 240 inverts the binary 0 to a binary 1 thereby outputting the '1' that was coupled to the gate of pull-down n-MOS transistor $205B_0$ by the coupled inverter pair 270. Thus, e.g., a microprocessor execution unit (not shown) reads data bits stored in the coupled inverter pair 270 of a register file cell.

FIG. 4 illustrates transistors coupled by a global bit-line to a data output line according to one embodiment of the invention. As FIG. 4 illustrates, each NAND gate $210_0$–$210_7$ has its outputs coupled to a corresponding output transistor e.g., pull-down transistor $220_0$–$220_7$ of corresponding banks (i.e., bank 0–bank 7). The output from the corresponding pull-down transistors $220_0$–$220_7$ is coupled via GBL0 to data output line D0 via an inverter 240. As described above, during read cycles from a multi-ported register file, data read from the register file cells have to traverse at least the LBL, the NAND gate, the pull-down transistor and the GBL prior to being available at the data output line. With multi-ported register files having a large number of rows of register file cells the read delay can be significant.

The read delay, i.e., the time taken for a data bit stored in a register file cell to become available at the data output line, is dependent in part upon the proximity (i.e., the RC bit-line delay) of the register file cell to the data output line. Register file cells that are further from the data output lines e.g., register file cells of row 0 and row 31 of the array, have a longer read delay than register file cells (e.g., register file cells 224 and 255) nearer the data output line. The read delay limits the maximum clock frequency at which the register files can properly operate.

Stronger transistors (i.e., transistors having a stronger drive current) placed at different parts of the register file decrease the read delay. A stronger drive current may be defined as the current flowing through the transistor when the transistor is on. Transistors can be made stronger by doing one or more of the following during the design of the transistor: increasing the channel width, reducing the channel length, or using a lower threshold voltage transistor. In one embodiment of the invention, selected transistors of the register file cells, and/or selected transistors of the NAND gate, and/or selected output transistors (e.g., pull-down transistors) coupled to the GBLs may be made stronger to decrease the read delay. In one embodiment of the invention, as illustrated in FIG. 2, in any bank at least one pull-down transistor in the first row of register file cells (e.g., transistor $205A_0$) and/or the last row of register file cells (e.g., $205A_{31}$) of the bank may be made stronger. These selected pull-down transistors (i.e., the stronger pull-down transistors in first and last row of the bank) may be substantially equidistant and furthest away from the NAND gate, and are therefore furthest away from the data output lines D0–D31. In addition, at least these selected pull-down transistors may be made stronger as compared with corresponding selected pull-down transistors in one or more of the other banks. In one embodiment of the invention, the selected pull-down transistors in the banks progressively further away from the data output lines may be made progressively stronger as compared with corresponding pull-down transistors in banks nearer the data output lines. Thus, the selected pull-down transistors in bank 6 may be made stronger compared with the corresponding selected pull-down transistors in bank 7. The corresponding selected pull-down transistors in bank 5 may be made stronger as compared with the corresponding selected pull-down transistors in bank 6 and so on.

In one embodiment of the invention, selected transistors of the NAND gate (or any other equivalent circuit that merges the LBLs) in banks progressively further away from the data output lines may be made progressively stronger as compared with corresponding selected transistors of the NAND gates in banks nearer the data output lines. In one embodiment of the invention, selected transistors of the NAND gate comprise one or more transistors that comprise the NAND gate. Thus, the selected transistors of the NAND gates e.g., NAND gate $210_6$ in bank 6 may be made stronger compared with the corresponding selected transistors of the NAND gates in bank 7 e.g., NAND gate $210_7$. The corresponding selected transistors of the NAND gates in bank 5 e.g., NAND gate $210_5$ may be made stronger as compared with the corresponding selected transistors of the NAND gate in bank 6 e.g., NAND gate $210_6$ and so on.

In one embodiment of the invention, selected output transistors e.g., pull-down transistors coupled to the GBLs in banks progressively further away from the data output lines may be made progressively stronger as compared with corresponding selected pull-down transistors coupled to the GBLs in banks nearer the data output lines. Thus, the selected pull-down transistors coupled to the GBLs in bank 6 e.g., pull-down transistor $220_6$ may be made stronger compared with the corresponding selected pull-down transistors in bank 7 e.g., pull-down transistor $220_7$. The corresponding selected pull-down transistors of bank 5 may be made stronger as compared with the corresponding selected pull-down transistors in bank 6 and so on.

Figure 5:
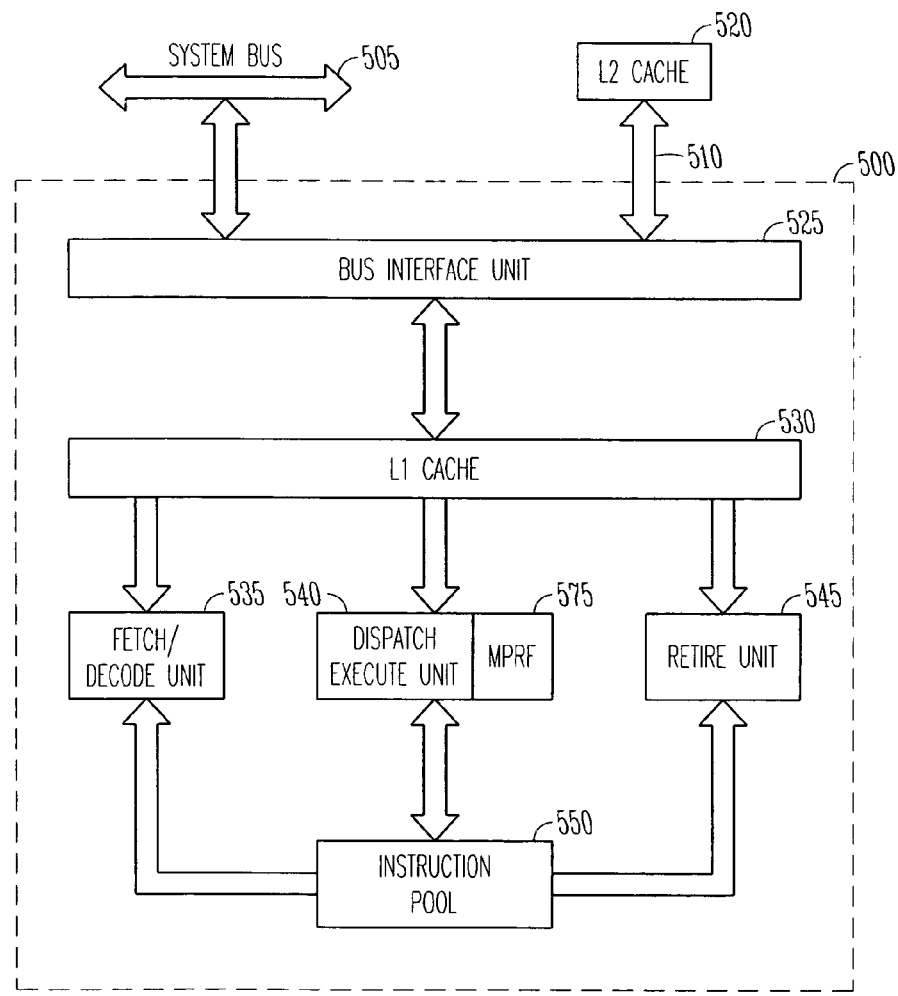
FIG. 5 illustrates a microprocessor using a multi-ported register file according to one embodiment of the invention.

FIG. 5 illustrates a microprocessor using a multi-ported register file according to one embodiment of the invention. As illustrated in FIG. 5 microprocessor 500 comprises an instruction pipeline subdivided into four processing units, i.e., the fetch/decode unit 535, the dispatch/execute unit 540, the retire unit 545, and the instruction pool 550. Instructions and data are supplied to the four processing units through the bus interface unit 525. The bus interface unit 525 obtains instructions and data from external memory (not shown) via system bus 505 or from L2 cache 520 via bus 510, and stores the instructions and data in L1 cache 530. The fetch/decode unit 535 reads a stream of instructions from L1 cache 560 and decodes them into a series of "micro-ops" that is sent to the instruction pool 550. The instruction pool 550 is basically a buffer that stores the micro-ops for the dispatch execute unit 540. The dispatch/execute unit 540 is an out-of-order unit that schedules and executes the micro-ops stored in the instruction pool according to data dependencies and resource availability and temporarily stores the results of these speculative executions. In one embodiment of the invention, the dispatch/execute unit comprises at least a multi-ported register file (MPRF) 575 as described with respect to FIGS. 2–4. The dispatch execute unit 540 executes instructions and writes results to register file cells in the multi-ported register file 575 without regard to other instructions that use the same multi-ported register file, thus, supporting out-of-order instruction execution. The retire unit 545 commits the results of the speculatively executed micro-ops to permanent machine state and removes the micro-ops from the instruction pool. The retire unit 545 checks the status of micro-ops in the instruction pool looking for micro-ops that have been executed and no longer have any dependencies with other micro-ops in the instruction pool. It then retires completed micro-ops in their original program order, taking into account interrupts, exceptions, breakpoints, and branch mispredictions. Although the embodiment of FIG. 5 uses an out-of-order processor to process instructions, other embodiments of the invention may use a sequential processor or any other processor, such as a digital signal processor, so long as the multi-ported register file used in the processor is as described with respect to FIGS. 2–4.

Figure 6:
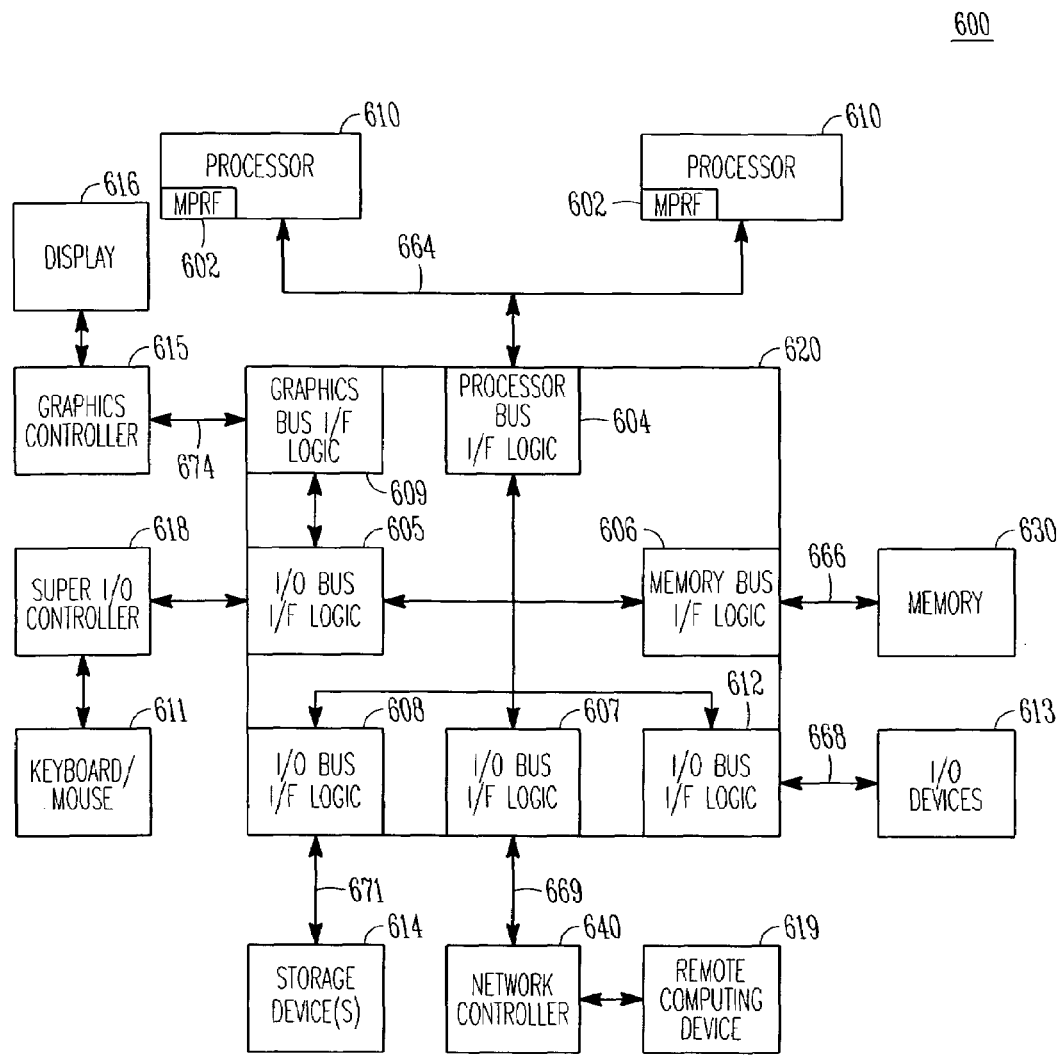
FIG. 6 illustrates a computer system using a register file according to one embodiment of the invention.

FIG. 6 illustrates a computer system using a multi-ported register file according to one embodiment of the invention. As illustrated in FIG. 6, the computer system 600 may comprise one or more processors 610, and a chipset 620. Processors 610 may comprise at least one multi-ported register file (MPRF) 602 as illustrated with respect to FIGS. 2–4. In one embodiment of the invention, the processor bus 664 is a front side bus (FSB) as used with Intel® corporation's Pentium 4 processor. Chipset 620 may comprise one or more integrated circuit packages or chips.

In one embodiment of the invention chipset 620 includes processor bus interface (I/F) logic 604 coupled between processor bus 664 and one or more interfaces within chipset 620. In one embodiment of the invention, chipset 620 includes memory bus interface logic 606 to couple the chipset 620 to a memory 630 via a memory bus 666. In one embodiment of the invention, chipset 620 includes Input/Output (I/O) bus interface logic 612 coupled to I/O devices 613 via, e.g., I/O bus 668. A second I/O bus interface logic 607 couples chipset 520 to a network controller 640 using, e.g., I/O bus 669.

In one embodiment of the invention, network controller 640 couples the computer system 600 to one or more remote computing devices 619. For example, network controller 640 may comprise an Ethernet controller, a cable modem, a digital subscriber line (DSL) modem, etc. that may be used to couple the computer system 600 to one or more remote computing devices 619.

A third I/O bus interface logic 608 couples chipset 620 to one or more storage devices 614 using, e.g., a I/O bus 671. The storage devices 614 may store program code and/or data permanently, e.g., on a hard disk, or a magnetic storage device. A graphics bus interface logic 609 couples chipset 620 to a graphics controller 615 via a graphics bus 674. Graphics controller 615 is coupled to display device 616. I/O bus I/F logic 605 couples chipset 620 to super I/O controller 618 that is coupled to, e.g., a keyboard/mouse 611 etc.

Thus, a multi-ported register file has been disclosed. While there has been illustrated and described what are presently considered to be example embodiments of the present invention, it will be understood by those skilled in the art that various other modifications may be made, and equivalents may be substituted, without departing from the true scope of the invention. Additionally, many modifications may be made to adapt a particular situation to the teachings of the present invention without departing from the central inventive concept described herein. Therefore, it is intended that the present invention not be limited to the particular embodiments disclosed, but that the invention include all embodiments falling within the scope of the appended claims.

What is claimed is:

1. An apparatus comprising:
   a gate;
   a data output line;
   an output transistor;
   a first register file cell;
   a second register file cell;
   a Global Bit Line (GBL) to couple the gate to the data output line via the output transistor; and
   a Local bit Line (LBL) to couple the gate to the first register file cell and the second register file cell, said second register file cell disposed closer to the data output line than the first register file cell, said gate and said each register file cell comprising at least one transistor, said at least one transistor in the first register file cell having a stronger drive current than the at least one transistor in the second register file cell.

2. The apparatus of claim 1 wherein the output transistor, the gate, the first register file cell and the second register file cell comprise a first bank said first bank disposed further from the data output line than a second bank, said second bank comprising a corresponding output transistor, a corresponding gate, a corresponding first register file cell and a corresponding second register file cell, wherein the corresponding gate, the corresponding first register file cell, and the corresponding second register file cell of the second bank comprise at least one transistor.

3. The apparatus of claim 1 further comprising an inverter to couple the GBL to the data output line.

4. The apparatus of claim 1 wherein the at least one transistor in the first register file cell having a stronger drive current than the at least one transistor in the second register file cell comprises the at least one transistor in the first register file cell having at least one of a larger channel width, a smaller channel length and a lower threshold voltage compared to the at least one transistor in the second register file cell.

5. The apparatus of claim 2 wherein the output transistor of the first bank has a stronger drive current than the corresponding output transistor of the second bank.

6. The apparatus of claim 2 wherein the at least one transistor of the gate of the first bank having a stronger drive current than the at least one transistor of the gate of the second bank.

7. The apparatus of claim 2 wherein the at least one transistor of the register file cell of the first bank having a stronger drive current than the at least one transistor of the register file cell of the second bank.

8. An apparatus comprising:
   a first bank coupled to a second bank via a global bit line (GBL), said first bank disposed further from a data output line than the second bank, each bank comprising a first plurality of register file cells, a corresponding second plurality of register file cells, a gate, and a pull-down transistor, the gate to couple the first plurality of register file cells to the corresponding second plurality of register file cells, the pull-down transistor to couple the gate to the GBL, each register file cell in the first plurality of register file cells disposed at increasing distances from the gate, each register file cell in the corresponding second plurality of register file cells disposed at corresponding increasing distances from the gate such that a register file cell furthest from the gate in the first plurality of register file cells and a corresponding register file cell furthest from the gate in the second plurality of register file cells have a stronger drive current than a register file cell nearer to the gate in the first plurality of register file cells and a corresponding register file cell nearer to the gate in the second plurality of register file cells.

9. The apparatus of claim 8 wherein the pull-down transistor of the first bank has a stronger drive current than the pull-down transistor of the second bank.

10. The apparatus of claim 8 wherein the gate comprises at least one transistor such that leakage current of the at least one transistor of the gate of the first bank is greater than leakage current of the at least one transistor of the gate of the second bank.

11. The apparatus of claim 8 wherein the register file cells furthest from the gate in the first bank have a stronger drive current than register file cells furthest from the gate in the second bank.

12. The apparatus of claim 8 further comprising the GBL coupled to the data output line by an inverter.

13. An apparatus comprising:
   a microprocessor, said microprocessor comprising a bus interface unit, a dispatch execute unit coupled to the bus interface unit, and a multi-ported register file coupled to the dispatch execute unit; said multi-ported register file comprising a Global Bit Line (GBL) to couple a gate to a data output line via a pull-down transistor; a Local bit Line (LBL) to couple the gate to a first register file cell and a second register file cell, said second register file cell disposed closer to the data output line than the first register file cell, said gate and said each register file cell comprising at least one transistor, said at least one transistor in the first register file cell having a stronger drive current than the at least one transistor in the second register file cell.

14. The apparatus of claim 13 wherein the pull-down transistor, the gate, the first register file cell and the second register file cell comprise a first bank said first bank disposed further from the data output line than a second bank, said second bank comprising a corresponding pull-down transistor, a corresponding gate, a corresponding first register file cell and a corresponding second register file cell, wherein the corresponding gate, the corresponding first register file cell, and the corresponding second register file cell of the second bank comprise at least one transistor.

15. The apparatus of claim 13 further comprising an inverter to couple the GBL to the data output line.

16. The apparatus of claim 13 wherein the at least one transistor in the first register file cell having a stronger drive current than the at least one transistor in the second register file cell comprises the at least one transistor in the first register file cell having at least one of a larger channel width, a smaller channel length and a lower threshold voltage compared to the at least one transistor in the second register file cell.

17. The apparatus of claim 14 wherein the pull-down transistor of the first bank has a stronger drive current than the corresponding pull-down transistor of the second bank.

18. The apparatus of claim 14 wherein the at least one transistor of the gate of the first bank having a stronger drive current than the at least one transistor of the gate of the second bank.

19. The apparatus of claim 14 wherein the at least one transistor of the register file cell of the first bank having a stronger drive current than the at least one transistor of the register file cell of the second bank.

20. A computer system comprising:
a memory;
a network controller coupled to the memory; and
a processor coupled to the memory and the network controller said processor comprising a multi-ported register file coupled to the processor said multi-ported register file comprising a first bank coupled to a second bank via a global bit line (GBL), said first bank disposed further from a data output line than the second bank, each bank comprising a first plurality of register file cells, a corresponding second plurality of register file cells, a gate, and a pull-down transistor, the gate to couple the first plurality of register file cells to the corresponding second plurality of register file cells, the pull-down transistor to couple the gate to the GBL, each register file cell in the first plurality of register file cells disposed at increasing distances from the gate, each register file cell in the corresponding second plurality of register file cells disposed at corresponding increasing distances from the gate such that a register file cell furthest from the gate in the first plurality of register file cells and a corresponding register file cell furthest from the gate in the second plurality of register file cells have a stronger drive current than a register file cell nearer to the gate in the first plurality of register file cells and a corresponding register file cell nearer to the gate in the second plurality of register file cells.

21. The apparatus of claim 20 wherein the pull-down transistor of the first bank has a stronger drive current than the pull-down transistor of the second bank.

22. The apparatus of claim 20 wherein the gate comprises at least one transistor such that leakage current of the at least one transistor of the gate of the first bank is greater than leakage current of the at least one transistor of the gate of the second bank.

23. The apparatus of claim 20 wherein the register file cells furthest from the gate in the first bank have a stronger drive current than register file cells furthest from the gate in the second bank.

24. The apparatus of claim 20 further comprising the GBL coupled to the data output line by an inverter.

* * * * *